United States Patent [19]

Kunimoto et al.

[11] Patent Number: 4,797,307
[45] Date of Patent: Jan. 10, 1989

[54] PROCESS FOR THE PREPARATION OF POLYIMIDE FILM

[75] Inventors: Akihiro Kunimoto; Seiichiro Takabayashi; Yuji Matsui, all of Ube, Japan

[73] Assignee: Ube Industries, Ltd., Ube, Japan

[21] Appl. No.: 50,492

[22] Filed: May 14, 1987

[30] Foreign Application Priority Data

May 15, 1986 [JP] Japan .................................. 61-112277

[51] Int. Cl.$^4$ .......................... B05D 3/02; B29C 71/02
[52] U.S. Cl. ..................................... 427/386; 156/326; 156/329; 156/330; 264/216; 264/236; 264/331.19; 264/331.21; 427/387; 427/412.1; 427/419.1; 427/434.2; 428/447; 428/473.5
[58] Field of Search ........... 264/204, 216, 236, 331.19, 264/331.21, 344, 347; 156/329, 330, 326; 427/209, 210, 282, 387, 434.2, 386, 412.1, 419.1, 384; 428/447, 473.5, 689; 528/353

[56] References Cited

U.S. PATENT DOCUMENTS

| | | |
|---|---|---|
| 3,200,031 | 8/1965 | Rittenhouse .................... 156/329 X |
| 3,321,350 | 5/1967 | Fekete ................... 156/329 |
| 3,455,762 | 7/1969 | Harper ............... 156/329 X |
| 3,592,714 | 7/1971 | Katz ............................. 427/387 |
| 4,370,212 | 1/1983 | Mahr et al. ................ 428/447 X |
| 4,374,898 | 2/1983 | Mahr .............................. 428/447 |
| 4,378,324 | 3/1983 | Makino et al. ................ 264/216 X |
| 4,470,944 | 9/1984 | Asakura et al. ................ 264/216 |
| 4,473,523 | 9/1984 | Sasaki et al. ................ 264/204 X |
| 4,485,056 | 11/1984 | Makino et al. ............. 264/331.19 X |
| 4,512,893 | 4/1985 | Makino et al. ................ 264/216 X |
| 4,534,815 | 8/1985 | Hamada et al. ................ 156/329 X |
| 4,546,018 | 10/1985 | Ryuzo et al. ................ 156/329 X |
| 4,680,364 | 7/1987 | Lucas ............................. 427/387 X |

FOREIGN PATENT DOCUMENTS

| | | | |
|---|---|---|---|
| 2209627 | 7/1972 | Fed. Rep. of Germany ...... | 428/447 |
| 52-26585 | 2/1977 | Japan ................................. | 428/447 |
| 57-8141 | 1/1982 | Japan ................................. | 264/331.19 |
| 57-111324 | 7/1982 | Japan ................................. | 156/329 |
| 342423 | 6/1975 | U.S.S.R. ........................... | 264/216 |
| 952995 | 3/1964 | United Kingdom ................ | 156/329 |

OTHER PUBLICATIONS

Spaulding, E. C., Improving Adhesion of Silicone Rubber to Substrates, IBM Technical Disclosure Bulletin, vol. 11, No. 7, (Dec. 1968), p. 704.

Sacher, E. et al., Improving Bonding Strength of Polyimide-to-Silicon Wafers, IBM Technical Disclosure Bulletin, vol. 20, No. 6 (Nov. 1977), p. 2161.

Primary Examiner—Jeffery Thurlow
Assistant Examiner—Leo B. Tentoni
Attorney, Agent, or Firm—Frishauf, Holtz, Goodman & Woodward

[57] ABSTRACT

A process for the production of a polyimide film having an increased adhesiveness which includes the steps of: evenly coating a surface treating solution which contains a heat-resistant surface treating agent of aminosilane type, epoxysilane type or titanate type in an amount not less than 0.5 wt. % on a surface of a solid film comprising an aromatic polymer composition which contains 100 parts by weight of an aromatic polyamioc acid and 5-150 parts by weight of an organic polar solvent and heating the solid film having the coated surface treating solution at a temperature of 100°-600° C., to imidize the polyamic acid constituting the solid film as well as to dry the film.

17 Claims, No Drawings

PROCESS FOR THE PREPARATION OF POLYIMIDE FILM

BACKGROUND OF THE INVENTION

1. Field of the Invention

The present invention relates to a process for the preparation of a polyimide film which is improved in adhesiveness. More particularly, the invention relates to a process for the preparation of a polyimide film which is improved in adhesiveness to a metal foil such as a copper foil in the case of bonding the polyimide film to a metal foil through an epoxy type heat-resistant adhesive.

2. Description of Prior Art

It is generally known to prepare a high heat-resistant polyimide film using an aromatic polymer composition which comprises an aromatic polyamic acid produced from an aromatic tetracarboxylic acid component mainly containing a biphenyltetracarboxylic acid or a dianhydride thereof and an aromatic diamine component mainly containing a phenylene diamine, dissolved in an organic solvent by utilizing a solution casting method, etc., as described for instance in Japanese Patent Publication No. 60(1985)-42817.

The polyimide film of biphenyltetracarboxylic acid type prepared by the above-described method is very excellent in various properties such as heat resistance, mechanical strength and dimensional stability, so that the film is suitably employed as a support of a flexible circuit-printed copperplated board (FPC board). However, in the case of combining the polyimide film with a metal foil such as a copper foil by means of a heat-resistant epoxy resin adhesive, satisfactory bonding strength between the polyimide film and the metal foil is hardly obtained. Therefore, this problem has been expected to be solved.

For example, an IBM Report describes an result of an experiment of coating 0.1% aqueous solution of γ-aminopropyl-trimethoxysilane on a surface of a solid film of pyromellitic acid polyimide prepolymer and an organic solvent (Polymer Science Technology (USA) 29, 517-523, 1984).

SUMMARY OF THE INVENTION

The present inventors have found that when a solid film comprising a biphenyltetracarboxylic acid polyimide prepolymer and an organic solvent which is different from the solid film of pyromellitic acid polyimide prepolymer is treated on its surface by the above-described method, various problems are caused. For instance, it is difficult to coat the treating solution evenly on the solid film, or water contained in the treating solution causes hydrolysis of the polymer in a heating procedure to deteriorate the resultant polyimide film, resulting in marked decrease of mechanical properties of the film and heat resistance thereof.

According to the study for a method for improving adhesiveness of the aforementioned bisphenyltetracarboxylic acid type polyimide film, the present inventors have found that in the process of preparing a polyimide film having excellent properties such as high heat resistance by using an aromatic polymer composition (solution composition) comprising a tetracarboxylic acid-type aromatic polyamic acid (i.e. aromatic polyimide prepolymer) dissolved in an organic solvent through a solution casting method, etc., the treatment of a surface of a solid film containing a solvent (solvent-containing aromatic polyimide prepolymer film) with a specific surface treating solution makes it possible to produce "polyimide films improved in adhesiveness to a metal foil such as a copper foil through an epoxy type heat-resistant adhesive" with high industrial reproducibility.

Accordingly, an object of the present invention is to provide a process for the preparation of a polyimide film which is provided with improved surface adhesiveness.

Particularly, the invention has an object to provide a process for the preparation of a polyimide film which is improved in surface adhesiveness in the case of combining the film to metal foils such as a copper foil by means of an epoxy resin heat-resistant adhesive.

There is provided by the invention a process for the preparation of a polyimide film comprising the steps of:

evenly coating a surface treating solution which contains at least one of heat-resistant surface treating agents of aminosilane type, epoxysilane type and titanate type in an amount of not less than 0.5 wt. % and has a water content of not higher than 20 wt. % on a surface of a solid film of an aromatic polymer composition which contains 100 parts by weight of an aromatic polyamic acid and 5-150 parts by weight of an organic polar solvent, said aromatic polyamic acid being produced by polymerization of an aromatic tetracarboxylic acid component and an aromatic diamine component in essentially equimolar amounts wherein the tetracarboxylic acid component contains a biphenyltetracarboxylic acid or a dianhydride thereof in an amount of not less than 60 mol % and the aromatic diamine component contains a phenylene diamine in an amount of not less than 50 mol %; and heating said solid film having the coated surface treating solution thereon at a temperature of 100°-600° C. to imidize the polyamic acid constituting said solid film and simultaneously to dry said film.

DETAILED DESCRIPTION OF THE INVENTION

The above-mentioned aromatic tetracarboxylic acid component contains a biphenyltetracarboxylic acid or its derivative such as 2,3,3',4'-biphenyltetracarboxylic acid, its dianhydride, an ester of a lower alcohol having 1-5 carbon atoms, 3,3',4,4'-biphenyltetracarboxylic acid, its dianhydride, and an ester of a lower alcohol having 1-5 carbon atoms in an amount of not less than 60 mol %, preferably not less than 70 mol %, of the whole amount. Particularly, the aromatic tetracarboxylic acid component containing 3,3',4,4'-biphenyltetracarboxylic acid or its dianhydride in an amount of not less than 60 mol %, preferably not less than 70 mol % is most favorably employed in the invention, because the resulting polyimide film shows excellent properties such as high heat resistance and high mechanical strength.

The above-described biphenyltetracarboxylic acids can be employed in combination with other tetracarboxylic acids in the preparation of the aromatic tetracarboxylic acid component. Examples of other tetracarboxylic acids include pyromellitic acid, dianhydride thereof, benzophenonetetracarboxylic acid, dianhydride thereof, bis(3,4-dicarboxyphenyl)methane, dianhydride thereof, 2,2-bis(3,4-dicarboxyphenyl)propane, dianhydride thereof, bis(3,4-dicarboxyphenyl)sulfone, dianhydride thereof, and mixtures thereof.

The above-mentioned aromatic diamine component contains phenylenediamine such as p-phenylenediamine, m-phenylenediamine, 3,5-diaminotoluene and 2,5-diaminotoluene in an amount of not less than 50 mol %, preferably not less than 60 mol %, more preferably not less than 70 mol %, of the whole amount. Particularly, the aromatic diamine component containing p-phenylenediamine in an amount of not less than 60 mol %, preferably not less than 70 mol %, is most favorably employed in the invention.

The above-described phenylene diamine can be employed in combination with other aromatic dimines in the the aromatic diamine component. Examples of other aromatic diamines include diaminodiphenyl ethers such as 4,4′-diaminodiphenyl ether, 3,4′-diaminodiphenyl ether and 3,3′-diaminodiphenyl ether, 4,4′-diaminodiphenylmethane, 4,4′-diaminodiphenylpropane, 4,4′-diaminodiphenylsulfone, 4,4′-diaminodiphenylslfide, and mixtures thereof. In the invention, diaminodiphenyl ethers such as 4,4′-diaminodiphenyl ether are favorably employed.

When the amount of the phenylenediamine contained in the aromatic diamine component for the preparation of the aforementioned aromatic polyamic acid is too small, the resulting aromatic polyamic acid composition obtained using such aromatic diamine component and the aromatic tetracarboxylic acid component can hardly produce a polyimide film excellent both in heat resistance and mechanical properties.

The aromatic polyamic acid is a biphenyltetracarboxylic acid polyimide prepolymer obtained by polymerization reaction of the aromatic tetracarboxylic acid component with the aromatic diamine component at a low temperature as described above. Further the aromatic polyamic acid preferably has a logarithmic viscosity of 0.1-7 (at temperature of 30° C., concentration of 0.5 g/100 ml of solvent, N-methyl-2-pyrrolidone), preferably 0.2-5, and preferably has a imidation ratio (imidation ratio determined according to the infrared rays analysis, namely IR method) of not more than 85%, preferably not more than 70%. Furthermore, the aromatic polyamic acid preferably is a polymer capable of being homogeneously dissolved in the concentration of approx. 2-50 wt. %, particularly 5-40 wt. %, in an organic polar solvent.

The above-mentioned logarithmic viscosity is a value calculated by the following formula:

$$\text{logarithmic viscosity} = \frac{\text{natural logarithm (solution viscosity/solvent viscosity)}}{\text{concentration of solution}}$$

In the infrared rays analysis for determining an imidation ratio, the imidation ratio in a sample can be determined from the ratio of absorbance of the absorption peak assigned to the imide bonding per that assigned to the amide acid bonding in an infrared absorption spectrum of the sample.

There is no specific limitation on the organic polar solvent, provided that the organic polar solvent can homogeneously dissolve the above-mentioned aromatic polyamic acid in a concentration of approx. 2-50 wt. %, preferably 5-40 wt. %. Examples of the organic polar solvent include N,N-di(lower)alkylcarboxylamides such as N,N-dimethylformamide, N,N-diethylformamide, N,N-dimethylacetamide, N,N-diethylacetamide, and N,N-dimethylmethoxyacetamide; N-methyl-2-pyrrolidone; dimethylsulfoxide; diethylsulfoxide; dimethylsulfone; diethylsulfone; and hexamethylsulfoamide.

The solid film employed in the invention is a flexible and self-supporting solid film particularly in the continuous form which mainly contains the aromatic polyamic acid composition comprising 100 parts by weight of the polyamic acid and 5–150 parts by weight of the organic polar solvent (preferably, 10–120 parts by weight, more preferably 20–100 parts by weight). In the aromatic polyamic acid composition, the total amount of the aromatic polyamic acid and the organic polar solvent is preferably not less than 90 wt. %.

The solid film can be prepared, for instance, by the following solution casting process. The above-mentioned aromatic tetracarboxylic acid component and aromatic diamine component are subjected to polymerization reaction in essentially equimolar amounts in an organic polar solvent at a temperature of not higher than approx. 100° C., preferably 0° to 80° C. for approx. 0.1 to 10 hours to produce a high molecular weight aromatic polyamic acid (aromatic polyimide prepolymer). An aromatic polyamic acid solution containing thus produced aromatic polyamic acid in an organic polar solvent in an amount of approx. 2-50 wt. % is employed as a film-forming dope solution. The solution is coated on a surface of a support to form a liquid thin layer on the support at a casting temperature of not higher than approx. 150° C., preferably approx. from 20° to 130° C. The coated layer is then dried at a temperature of not higher than approx. 120° C., preferably from 20° to 100° C. for approx. 0.1 to 1 hour to form a solid film.

The solid film may contain fine particles of inorganic filler in a small amount within the film or on the surface thereof, if desired.

According to the process of the invention, at least one surface of the solid film, (or both surfaces thereof, if necessary) is evenly coated with a surface treating solution containing a specific heat-resistant surface treating agent in an amount of not less than 0.5 wt. % and having water content of not higher than 20 wt. % by the conventional coating methods such as a gravure coating, a silk screen method and a dipping method. The solid film coated with the surface treating solution on its surface(s) is then heated at a temperature of from 100° to 600° C. (preferably 120° to 550° C. for approx. 0.1 to 10 hours, more preferably 150° to 500° C. for approx. 0.2 to 5 hours), to imidize the polyamic acid forming the solid film in such a manner that the imidation ratio would become not less than 90%, that is, the amide-acid bonding would not substantially exist in the film. In the same place, the solvent is removed from the film through evaporation. Thus, an aromatic polyimide film having high adhesiveness can be prepared.

As the heat-resistant surface treating agent employable in the invention, there can be mentioned those of aminosilane type, epoxysilane type and titanate type. In more detail, the heat-resistant surface treating agent preferably has a decomposition temperature of not lower than 275° C., more preferably from 280° to 600° C., most preferably from 290° to 550° C. Preferred are epoxysilane type heat-resistant surface treating agents (coupling agents) such as β-(3,4-epoxycyclohexyl)-ethyl-trimethoxysilane and γ-gliicidoxypropyl-trimethoxysilane; aminosilane type heat-resistant surface treating agents (coupling agents) such as γ-aminopropyl-trimethoxysilane, γ-aminopropyl-triethoxysilane, N-β-(aminoethyl)-γ-aminopropyl-triethoxysilane, N-

(aminocarbonyl)-γ-aminopropyltriethoxysilane, N-[β-(phenylamino)-ethyl]-γ-aminoproyltriethoxysilane, and N-phenyl-γ-aminopropyl-triethoxysilane; and titanate type heat-resistant surface treating agents such as isopropyl-tricumylphenyl titanate, and dicumylphenyl-oxyacetate titanate. Particularly preferred are N-phenyl-γ-aminopropyl-trimethoxysilane and N-phenyl-γ-aminopropyl-triethoxysilane.

The aforementioned surface treating solution contains the heat-resistant surface treating agent in an amount of not less than 0.5 wt. %, preferably in the range of 1 to 100 wt. %, more preferably in the range of 3 to 60 wt. %, most preferably in the range of 5 to 55 wt. %, based on the whole amount of the solution, and has water content of not higher than 20 wt. %, preferably not higher than 10 wt. %, more preferably not higher than 5 wt. %. Further, the surface treating solution has a rotational viscosity (solution viscosity measured by a rotational viscometer at 25° C.) of 10–50,000 cP.

In the invention, particularly preferred is a surface treating solution having a low concentration (particularly having a rotational viscosity of 10–5,000 cP) which contains the above-mentioned heat-resistant surface treating agent in an amount of not less than 0.5 wt. %, preferably 1–60 wt. %, more preferably 3–55 wt. % homogeneously dissolved in an organic polar solvent such as a lower alcohol and an amide type solvent. As the organic polar solvent for the surface treating solution, there can be employed the same solvents for polymerization as used for the preparation of the aforementioned aromatic polyamic acid or the same solvents as contained in the solid film employed in the invention. Otherwise, there can be employed other solvents such as lower alcohols having 1–5 carbon atoms (e.g., ethyl alcohol, methyl alcohol, propyl alcohol and butyl alcohol) and the mixtures thereof.

The heating is slowly performed at a temperature of approx. 100° to 400° C. for approx. 0.1 to 5 hours, preferably 0.2 to 3 hours, so as to imidize the polymer and to remove the solvent from the film through evaporation. The heating procedure is preferably done by plural steps under such conditions that the heating is carried out first at a relatively low temperature of approx. 100° to 170° C. for a heating time of approx. 1 to 30 minutes (first heating), then at a temperature of 170° to 220° C. for approx. 1 to 30 minutes (secondary heating), and finally at a high temperature of 220° to 400° C. for approx. 1 to 30 minutes (third heating).

After the third heating, the subsequent heating may be performed at a higher temperature of 400° to 600° C. (fourth heating), if necessary. In the continuous heating at a temperature of not lower than 250° C., it is preferred to fix at least on both sides of the solid film which are in the right-angle directions to the longitudinal direction of the continuous form film by means of pin tenters, clips, frames, etc.

The present invention is further illustrated by the following examples.

REFERENCE EXAMPLE 1

As the solid film, a flexible solid film in the continuous form of 40 μm thick and 500 mm wide which comprised 100 parts by weight of an aromatic polyamic acid (imidation ratio: approx. 60%, logarithmic viscosity: 3.2) having been obtained from 3,3',4,4'-biphenyltetracarboxylic acid dianhydride and p-phenylenediamine and 45 parts by weight of N-dimethylacetamide was employed. The employed solid film was a film having been prepared by a process comprising the steps of cast-coating the aromatic polyamic acid solution onto a surface of a false metal support, removing a portion of the solvent from the coated layer (film) through evaporation, and peeling off the film from the false support.

The solid film was heated first at 150° C. for 5 min., then at 200° C. for 7 min., further at 250° C. for 9 min., and finally at 450° C. for 7 min., to perform imidation of the polymer and to dry the film. Thus, an aromatic polyimide film having thickness of 25 μm was prepared.

Independently, an epoxy type adhesive (Haysol: OX-035, available form Hysol Japan Co., Ltd.) was coated on a surface of an electrolytic copper foil having thickness of 35 μm. The copper foil having the coated layer of the adhesive was then dried at 120° C. for 30 min., to form an adhesive layer (thickness: 200 μm) on the copper foil.

Subsequently, on the adhesive layer of the electrolytic copper foil was superposed the above-obtained aromatic polyimide film, and then they were together pressed at 170° C. under pressure of 40kg/cm$^2$ for 5 min. to produce a laminate sheet. After the laminate sheet was dried at 180° C. for 60 min., the sheet was allowed to stand for approx. 13 hrs. The laminate sheet was evaluated on separation tendency between the copper foil and the polyimide film according to a T(90°)-peel test (ASTM-D-1875) and a 180°-peel test (ASTM-D-903).

The results are set forth in Table 1.

EXAMPLES 1–5

Using the solvents shown in Table 1, a variety of N-phenyl-γ-aminopropyl-triethoxysilane surface testing solutions (amount of silane compound: 5 wt. %) were prepared. Each of those solutions was introduced into a sample tube, and allowed to stand at 25° C. for one week. The solutions were evaluated on the stability by observing the separation of the dissolved substance. It was confirmed that each of the solutions was kept as a homogeneously solution.

Subsequently, on a surface of the same flexible solid film of continuous form (width: 500 mm) as used in Reference Example 1 was coated each of the above-prepared N-phenyl-γ-aminopropyl-triethoxysilane surface treating solutions (amount of silane compound: 5 wt. %). The solid films having been coated with the surface treating solutions were subjected to the same heating treatment as described in Reference Example 1, to prepare a variety of aromatic polyimide films.

On an electrolytic copper foil was formed an epoxy type adhesive layer in the same manner as described in Reference Example 1. Each of the above-prepared aromatic polyimide films was combined with the copper foil through the adhesive layer to form various laminate sheets in the same manner as described in Reference Example 1. Each of the laminate sheets was evaluated on separation between the copper foil and the polyimide film according to the aforementioned T-peel test and 180°-peel test.

The results are set forth in Table 1.

EXAMPLES 6–7

The procedures of Examples 1 and 2 were repeated except for replacing γ-aminopropyl-triethoxysilane with γ-aminopropyl-trimethoxysilane. Each of the resulting laminate sheets was evaluated on separation between the copper foil and the polyimide film in the same manner as described in Example 1.

The results are set forth in Table 1.

COMPARISON EXAMPLE 1

Using water as solvent, an N-phenyl-γ-aminopropyl-triethoxysilane surface treating solution (amount of silane compound: 0.1 wt. %) was prepared. The solution was introduced into a sample tube, and allowed to stand at 25° C. for one week. The solution was evaluated on the stability by observing the separation of the dissolved substance. Any change was not found in the solution.

The procedure of Example 1 was repeated except for using the above-obtained surface treating aqueous solution to prepare an aromatic polyimide film. The silane compound was decomposed in the heating procedure. Further, the obtained aromatic polyimide film was prominently deteriorated in the heating procedure in contact with water.

Subsequently, the aromatic polyimide film was combined with a copper foil having an adhesive layer thereon to produce a laminate sheet in the same manner as stated in Reference Example 1. The laminate sheet was evaluated on separation between the copper foil and the polyimide film according to the aforementioned T-peel test and 180°-peel test.

The results are set forth in Table 1.

COMPARISON EXAMPLE 2

Using water as solvent, a N-phenyl-γ-aminopropyl-triethoxysilane surface treating solution (amount of silane compound: 1 wt. %) was prepared. The solution was introduced into a sample tube, and allowed to stand at 25° C. for one week. The solution was evaluated on the stability by observing the separation of the dissolved substance. Various changes such as turbidity, occurrence of precipitate, or separation of dissolved substance were found in the solution.

The procedure of Example 1 was repeated except for using the above-obtained surface treating aqueous solution to prepare an aromatic polyimide film. The silane compound was decomposed in the heating procedure. Further, the obtained aromatic polyimide film was prominently deteriorated in the heating procedure in contact with water.

Subsequently, the aromatic polyimide film was combined with a copper foil having an adhesive layer thereon to produce a laminate sheet in the same manner as stated in Reference Example 1. The laminate sheet was evaluated on the separation tendency between the copper foil and the polyimide film according to the aforementioned T-peel test at 180°-peel test.

The results are set forth in Table 1.

COMPARISON EXAMPLE 3

Using aqueous ethanol (water:ethanol=50:50, by weight) as a solvent, a N-phenyl-γ-aminopropyl-triethoxysilane surface treating solution (amount of silane compound: 5 wt. %) was prepared. The solution was introduced into a sample tube, and allowed to stand at 25° C. for one week. The solution was evaluated on the stability by observing the separation of the dissolved substance. Various changes such as turbidity, occurrence of precipitate, or separation of dissolved substance were found in the solution.

The procedure of Example 1 was repeated except for using the above-obtained surface treating aqueous solution to prepare an aromatic polyimide film. The silane compound was decomposed in the heating procedure.

Further, the obtained aromatic polyimide film was prominently deteriorated in the heating procedure in contact with water.

Subsequently, the aromatic polyimide film was combined with a copper foil having an adhesive layer thereon to prepare a laminate sheet in the same manner as stated in Reference Example 1. The obtained laminate sheet was subjected to the aforementioned T-peel test and 180°-peel test. It was confirmed that the adhesion properties varied depending upon the examined parts of the film and that the film was not provided with stable adhesiveness.

TABLE 1

|  | Solvent | T-peel Test Surface | | 180°-peel Test Surface | |
| --- | --- | --- | --- | --- | --- |
|  |  | B | F | B | F |
| Example 1 | 100% EtOH | 1.8 | 1.5 | 3.9 | 3.1 |
| Example 2 | 100% DMAc | 1.6 | 1.5 | 3.8 | 3.0 |
| Example 3 | 100% MeOH | 1.4 | 1.5 | 2.6 | 2.6 |
| Example 4 | 90% EtOH | 0.9 | 0.8 | 2.5 | 2.5 |
| Example 5 | no solvent | 0.9 | 0.5 | 2.1 | 2.0 |
| Example 6 | 100% EtOH | 1.9 | 1.5 | 3.9 | 3.1 |
| Example 7 | 100% DMAc | 1.6 | 1.6 | 3.9 | 3.1 |
| Ref. Example | no treatment | 0.03 | 0.02 | 0.3 | 0.4 |
| Com. Ex. 1 | 100% Water (0.1%) | unmeasured | | unmeasured | |
| Com. Ex. 2 | 100% Water (1%) | unmeasured | | unmeasured | |

Note:
100% EtOH: 100% ethanol;
100% DMAc: 100% N,N—dimethylacetamide;
100% MeOH: 100% methanol;
90% EtOH: 90% ethanol (residual portion: water);
no solvent: Commercially available N—phenyl-γ-amino-propyl-triethoxysilane surface treating solution with no dilution made;
Surface B: surface having faced the support in the preparation of the solid film by casting;
Surface F: surface having not faced the support in the preparation of solid film by casting;
unmeasured: Measurement on adhesion strength of the polyimide film was impossible because of severe deterioration.

EXAMPLE 8

An N-(aminocarbonyl)-γ-aminopropyl-triethoxysilane surface treating solution (solvent: 100% N,N-dimethylacetamide, amount of silane compound: 5 wt. %) was prepared. The surface treating solution was evaluated on the stability in the same manner as described in Example 1. It was confirmed that the solution was kept in the homogeneously dissolving state.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

EXAMPLE 9

An N-[β-(phenylamino)-ethyl]-γ-aminopropyl-triethoxysilane surface treating solution (solvent: 100% N,N-dimethylacetamide, amount of silane compound: 5 wt. %) was prepared. The surface treating solution was evaluated on the stability in the same manner as described in Example 1. It was confirmed that the solution was kept in the homogeneously dissolving state.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

EXAMPLE 10

A β-(3,4-epoxycyclohexyl)-ethyl-triethoxysilane surface treating solution (solvent: 100% N,N-dimethylacetamide, amount of silane compound: 5 wt. %) was prepared. The surface treating solution was evaluated on the stability in the same manner as described in Example 1. It was confirmed that the solution was kept as a homogeneously solution.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

EXAMPLE 11

An isopropyl-tricumylphenyl-titanate surface treating solution (solvent: 100% N,N-dimethylacetamide, amount of titanate compound: 5 wt. %) was prepared. The surface treating solution was evaluated on the stability in the same manner as described in Example 1. It was confirmed that the solution was kept as a homogeneous solution.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

EXAMPLE 12

A dicumylphenyl-oxyacetate-titanate surface treating solution (solvent: 100% N,N-dimethylacetoamide, amount of titanate compound: 5 wt. %) was prepared. The surface treating solution was evaluated on the stability in the same manner as described in Example 1. It was confirmed that the solution was kept as a homogeneous solution.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

EXAMPLE 13

An N-phenyl-γ-aminopropyl-triethoxysilane surface treating solution (solvent: 100% ethanol, amount of silane compound: 30 wt. %) was prepared. The surface treating solution was evaluated on the stability in the same manner as described in Example 1. It was confirmed that the solution was kept as a homogeneous solution.

Using the above-obtained surface treating solution, an aromatic polyimide film treated with the solution on its surface was prepared in the same manner as described in Example 1. The aromatic polyimide film was combined with a copper foil having an adhesive layer thereon, to produce a laminate sheet in the same manner as described in Example 1. The obtained laminate sheet was subjected to the aforementioned T-peel test and 180°-peel test.

The results are set forth in Table 2.

TABLE 2

|  | T-peel Test Surface | | 180°-peel Test Surface | |
|---|---|---|---|---|
|  | B | F | B | F |
| Example 8 | 0.4 | 0.4 | 2.5 | 2.8 |
| Example 9 | 1.0 | 0.7 | 2.6 | 2.5 |
| Example 10 | 1.8 | 1.9 | 2.5 | 2.4 |
| Example 11 | 0.8 | 0.5 | 2.8 | 2.6 |
| Example 12 | 0.4 | 0.5 | 2.3 | 2.8 |
| Example 13 | 1.2 | 0.9 | 3.2 | 3.3 |

EVALUATION OF SILANE COMPOUND TREATED-FILM

The polyimide film with no surface treatment obtained in Reference Example 1, the polyimide film treated with a 100% ethanol solution of silane compound obtained in Example 1, and the polyimide film treated with a 50% aqueous ethanol solution of silane compound obtained in Comparison Example 3 were evaluated on the tensile strength, tensile elongation and the elasticity according to the tensile test defined in ASTM-D-882. The results are set forth in Table 3.

TABLE 3

|  | Strength (kg/mm$^2$) | Elongation (%) | Elasticity (kg/mm$^2$) |
|---|---|---|---|
| Ref. Example 1 | 40.3 | 37.4 | 904 |
| Example 1 | 42.4 | 41.6 | 923 |
| Com. Example 3 | 29.0 | 24.3 | 927 |

As is evident from the results shown in Table 3, the polyimide film prepared by treating with a solution containing a large amount of water (Comparison Example 3) was markedly deteriorated, resulting in prominent decrease of physical properties.

We claim:

1. A process for the preparation of a polyimide film comprising the steps of:

evenly coating unto the surface of a solid film, a surface treating solution which contains at least one heat-resistant surface treating agent selected from the group consisting of aminosilane type, epoxysilane type and titanate type in an amount of not less than 0.5 wt. % and has a water content of not higher than 20 wt. %; said solid film being formed of an aromatic polymer composition which contains 100 parts by weight of an aromatic polyamic acid and 5-150 parts by weight of an organic polar solvent, said aromatic polyamic acid being produced by polymerization of an aromatic tetracarboxylic acid component and an aromatic diamine component in essentially equimolar amounts wherein the tetracarboxylic acid component contains a biphenyltetracarboxylic acid or a dianhydride thereof in an amount of not less than 60 mol % and the aromatic diamine component contains a phenylene diamine in an amount of not less than 50 mol %; and heating said solid film having the coated surface treating solution thereon to a temperature of 100°–600° C. to imidize the polyamic acid constituting said solid film and simultaneously to dry said film.

2. The process as claimed in claim 1, wherein said heat-resistant surface treating agent has a decomposition temperature of not lower than 275° C.

3. The process as clamied in claim 1, wherein the water content of said surface treating solution is not higher than 5 wt. %.

4. The process as claimed in claim 1, wherein said surface treating solution contains at least one of the heat-resistant surface treating agents in an amount of not less than 1.0 wt. %.

5. The process as claimed in claim 1, said heatresistant surface treating agent is N-phenyl-γ-aminopropyl-trimethoxysilane or N-phenyl-γ-aminopropyltriethoxysilane.

6. The process as claimed in claim 1, wherein said aromatic polymer composition contains 10 to 120 parts by weight of organic solvent to 100 parts by weight aromatic polyamic acid.

7. The process as claimed in claim 6 wherein 20 to 100 parts by weight of the organic solvent is used.

8. The process as claimed in claim 1 wherein the heating of said solid film is to a temperature of 120° to 550° C. for approximately 0.1 to 10 hours.

9. The process as claimed in claim 8 wherein the temperature is 150° to 500° C. and heating is for approximately 0.2 to 5 hours.

10. The process of claim 2 wherein said decomposition temperature is from 280° to 600° C.

11. The process of claim 10 wherein said decomposition temperature is from 290° to 550° C.

12. The process of claim 10 wherein epoxysilane type heat-resistant surface treating agents are used.

13. The process of claim 12 wherein said treating agent is selected from the group consisting of β-(3,4-epoxycyclohexyl)-ethyl-trimethoxysilane and γ-glicidoxypropyl-trimethoxysilane.

14. The process of claim 10 wherein aminosilane type heat-resistant surface treating agents are used.

15. The process of claim 14 wherein said treating agent is selected from the group consisting of
γ-aminopropyl-trimethoxysilane, γ-aminopropyl-triethoxysilane, N-β-(aminoethyl)-γ-aminopropyl-triethoxysilane, N-(aminocarbonyl)-γ-aminopropyl-triethoxysilane and N-[β-(phenylamino)-ethyl]-γ-aminopropyltriethoxysilane.

16. The process of claim 10 wherein titanate type heat-resistant surface treating agents are used.

17. The process of claim 16 wherein said treating agent is selected from the group consisting of isopropyl-tricumylphenyl titanate, and dicumylphenyl-oxyacetate titanate.

* * * * *